United States Patent [19]

Los et al.

[11] 4,054,835

[45] Oct. 18, 1977

[54] RAPID RESPONSE GENERATING VOLTMETER

[75] Inventors: Edward Joseph Los, Pittsfield; David Russell Humphreys, Dalton, both of Mass.

[73] Assignee: General Electric Company, Philadelphia, Pa.

[21] Appl. No.: 744,066

[22] Filed: Nov. 22, 1976

[51] Int. Cl.² ............... G01R 5/28; G01R 29/08
[52] U.S. Cl. .................... 324/109; 324/72; 324/130
[58] Field of Search .......... 324/109, 32, 72, 130; 330/9; 324/120

[56] References Cited

U.S. PATENT DOCUMENTS 2,877,308  3/1959  Reiner et al. ............... 330/9

OTHER PUBLICATIONS

Trump et al; "Generating Voltmeter ..."; Rev. of Sci. Instruments; Feb. 1940; pp. 54–56.

Primary Examiner—Rudolph V. Rolinec
Assistant Examiner—Ernest F. Karlsen
Attorney, Agent, or Firm—William Freedman

[57] ABSTRACT

A rapid-response generating voltmeter for measuring a high d-c voltage between a high voltage electrode and ground comprises two sets of stator segments, the segments of each set being electrically interconnected and each set being connected through its own capacitor to ground. Each set of stator segments has a time-varying capacitance with respect to the high voltage electrode, but the sum of these time-varying capacitances is maintained substantially constant with time.

First and second circuit means respectively sense the voltages $e_1$ and $e_2$ present across said two capacitors and develop first and second intermediate signals $e_5$ and $e_6$ substantially proportional to $e_1$ and $e_2$, respectively, minus, in each case, an error voltage attributable to discharge of the associated one of said capacitors. Summing means develops an output signal substantially proportional to the instantaneous sum of $e_5$ and $e_6$, and this output signal is substantially proportional to the high d-c voltage being measured.

14 Claims, 9 Drawing Figures

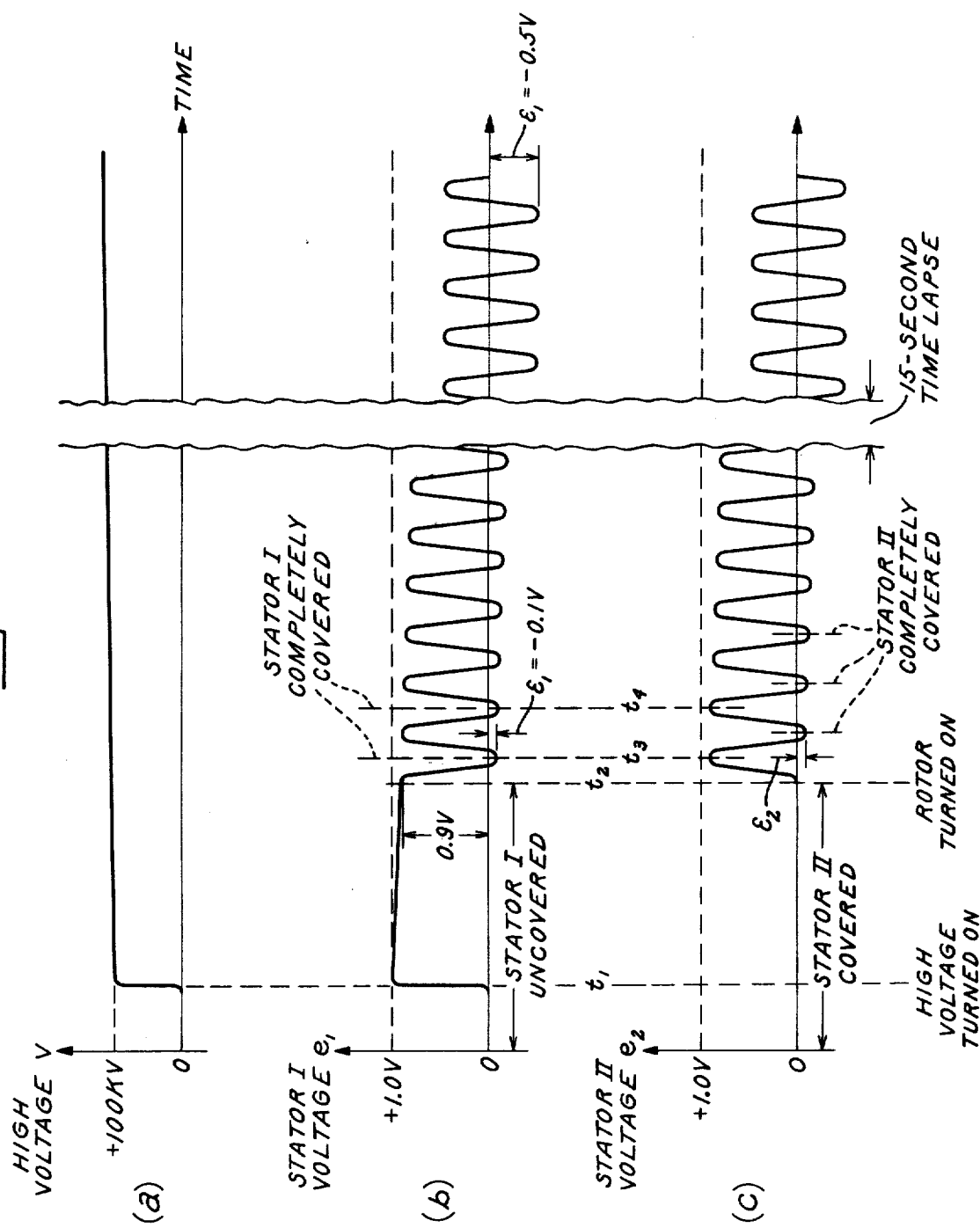

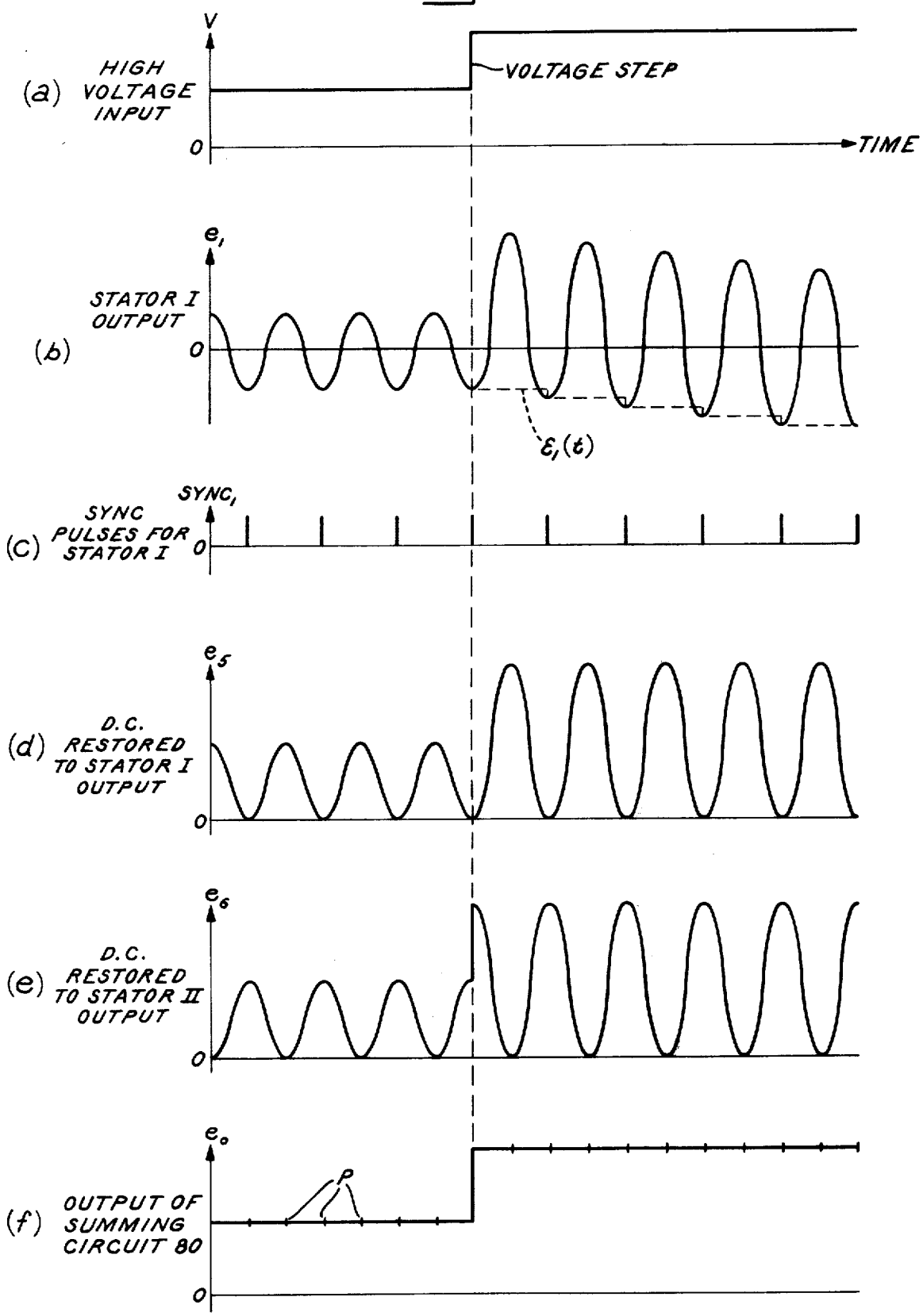

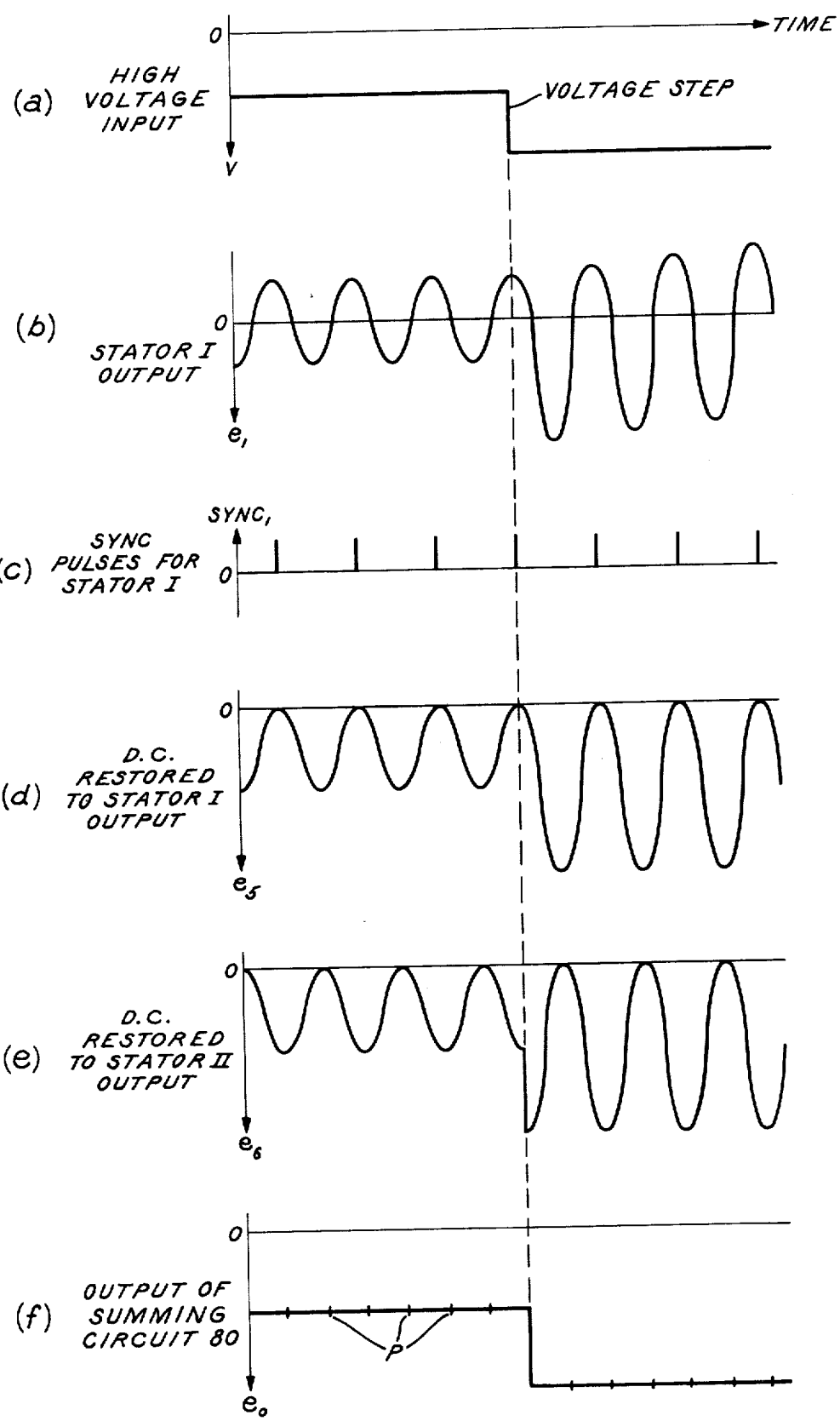

//]: #

RAPID RESPONSE GENERATING VOLTMETER

BACKGROUND

This invention relates to a generating voltmeter and, more particularly, to a generating voltmeter that has a rapid response to changes in the voltage being measured.

A generating voltmeter is a device which uses a time-varying capacitance to measure d-c high voltages. In its basic form, the generating voltmeter comprises a motor-driven rotor that comprises one or more metal vanes at ground potential. When the rotor is rotated, it alternately covers and uncovers a stator that is connected to ground through a load resistance. When the rotating rotor and the stator are exposed to the electric field of a high voltage electrode located a short distance away, an alternating current flows through the stator and the load resistance to ground. This current is usually rectified and filtered to produce a d-c signal related in magnitude to the high voltage being measured.

The response time of such a basic generating voltmeter to voltage changes is limited by the speed of the rotor vanes. Ordinary generating voltmeters have a response time on the order of 100 milliseconds. This is much too slow to enable such a generating voltmeter to be used for controlling high voltage d-c power transmission systems. Precision resistors can be used for obtaining a suitable voltage measurement in such power systems, but such resistors are quite expensive and large.

SUMMARY

An object of our invention is to provide a generating voltmeter that has a fast enough response to be used for controlling a high voltage d-c power system.

Another object is to provide a rapid-response generating voltmeter that can provide accurate polarity information as to the voltage being measured.

Another problem that is present in the basic generating voltmeter referred to hereinabove is that, because of the moving rotor, any a-c frequencies which are present on the high voltage electrode appear distorted at the output of the generating voltmeter. This distortion makes it very difficult, if not impossible, to accurately observe a-c transients using the basic generating voltmeter.

Accordingly, another object of our invention is to provide a generating voltmeter that is able to provide an output that accurately shows a-c transients in the input to the generating voltmeter.

In carrying out our invention in one form, we provide a generating voltmeter for measuring a high d-c voltage between first and second spaced-apart points. The voltmeter comprises a first electrode operated at the potential of the first point and a second electrode spaced from the first electrode and comprising a first stator including a plurality of segments arranged in angularly-spaced relation about a predetermined center. These first stator segments are electrically interconnected so as to be at the same potential as each other, and a first capacitor is connected between said first stator and said second point.

A third electrode spaced from the first electrode and similar in construction to said second electrode has its angularly-spaced, electrically-interconnected stator segments positioned physically between the segments of the first stator, and a second capacitor is connected between said second stator segments and said second point.

The voltmeter further comprises capacitance-varying means for periodically varying in opposite senses the capacitance between said first electrode and said second electrode and the capacitance between said first electrode and said third electrode. This capacitance-varying means comprises a rotor having vanes normally at the potential of said second point located between the first electrode and the segments of the stators. Rotation of this rotor causes the vanes to gradually cover the segments of one stator with respect to said first electrode as said vanes gradually uncover the segments of the other stator with respect to said first electrode.

First circuit means senses the voltage across said first capacitor while the rotor is rotating and develops a first intermediate signal varying in magnitude directly in accordance with: the instantaneous voltage then present across said first capacitor minus a first error voltage substantially equal to the voltage appearing across said first capacitor at the immediately-preceding instant when the segments of the first stator were effectively completely covered by the vanes of said rotating rotor.

Second circuit means senses the voltage across said second capacitor and develops a second intermediate signal varying in magnitude directly with the instantaneous voltage then present across said second capacitor minus a second error voltage substantially equal to the voltage appearing across said second capacitor at the immediately-preceding instant when the segments of said second stator were effectively completed covered.

Summing means develops an output substantially proportional to the instantaneous sum of said first and second intermediate signals, and this output is substantially proportional to the high d-c voltage being measured. An important relationship contributing to the accuracy of the voltmeter is that the sum of the capacitance between said first electrode and said second electrode and the capacitance between said first electrode and said third electrode remains substantially constant during rotation of the rotor.

BRIEF DESCRIPTION OF DRAWINGS

For a better understanding of the invention, reference may be had to the accompanying drawings, wherein:

FIG. 7 shows certain waveforms associated with our voltmeter when responding to a high voltage V such as depicted in curve (a) of FIG. 7.

FIG. 8 shows certain waveforms associated with our voltmeter when responding to a high voltage V such as depicted in curve (a) of FIG. 8.

FIG. 9 shows certain waveforms associated with our voltmeter when responding to a high voltage V such as depicted in curve (a) of FIG. 9.

DETAILED DESCRIPTION OF PREFERRED EMBODIMENT

COMPONENTS FOR DEVELOPING VOLTAGES $e_1$ and $e_2$

Figure 1:
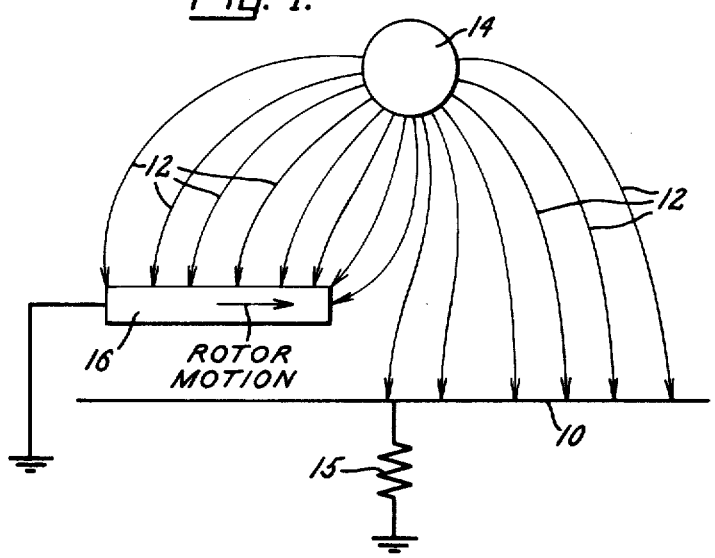
FIG. 1 diagrammatically illustrates a basic generating voltmeter of the prior art.

Referring first to FIG. 1, the basic generating voltmeter of the prior art diagrammatically illustrated therein comprises a stationary plate 10 placed in the electric field 12 of a high voltage d-c electrode 14. The stationary plate is connected to ground through a resistor 15. A movable plate or rotor 16 at ground potential is located in the electric field between stationary plate 10 and the high voltage d-c electrode 14. If movable plate 16 remains stationary, no current will flow through stationary plate 10 to ground because the field at the stationary plate 10 is constant in time. However, if the movable plate 16 is moved, the field at the stationary plate will change, and this change in field will cause a current to flow through resistor 15. When the manner in which the moving plate passes over the stationary plate is periodic, the mechanically-induced current can be related to the d-c voltage level of the high voltage electrode 14. Thus, the basic generating voltmeter can be used to measure the voltage level of the high voltage d-c electrode.

There are several problems with generating voltmeters having the type of construction shown in FIG. 1. First, they cannot determine the polarity of the d-c voltage being measured. Second, a significant d-c error is introduced if certain a-c frequencies are superimposed on the d-c high voltage. Third, any a-c frequencies which exist on the high voltage electrode will appear distorted at the generating voltmeter output because of the moving plate, thus making it difficult, if not impossible, to accurately observe a-c transients with this device. These difficulties have been largely eliminated in the rapid-response generating voltmeter described in detail hereinafter.

Figure 2:
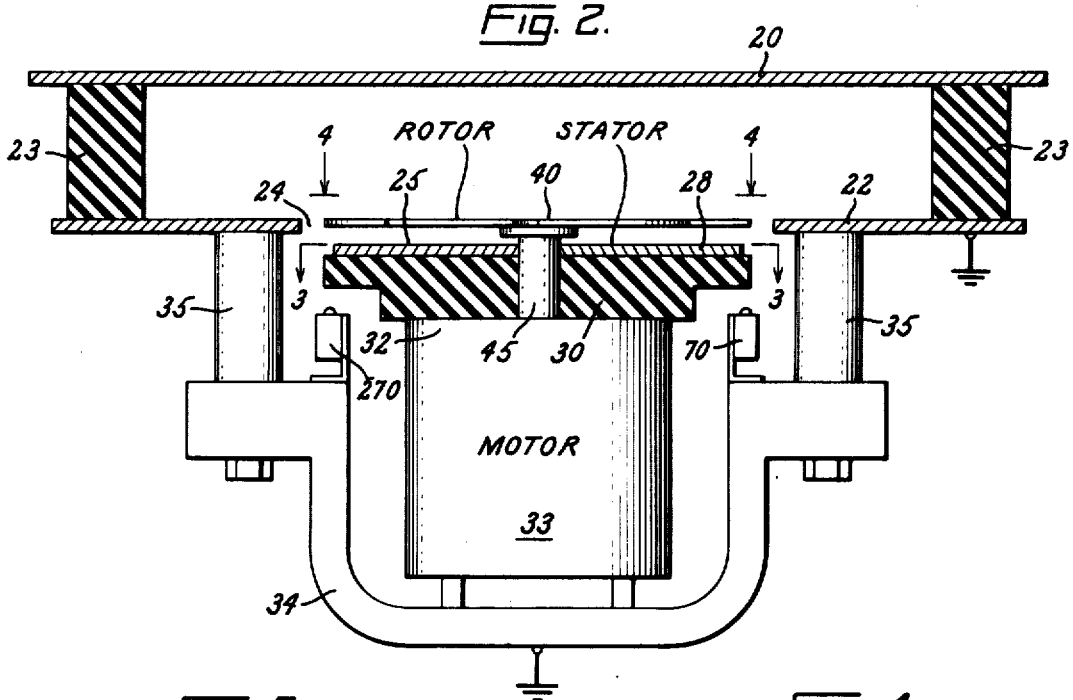
FIG. 2 is a sectional view through a generating voltmeter embodying one form of our invention.

Referring first to FIG. 2, our rapid-response generating voltmeter comprises a high-voltage metal electrode, or plate, 20 that is operated at the potential of a high voltage d-c line. It is desired to continuously measure the voltage present between this plate 20 and ground. A grounded metal plate 22 substantially parallel to plate 20 is located in spaced relation to the high voltage plate 20, and insulators 23 are used for supporting plate 20 on grounded plate 22.

Figure 3:
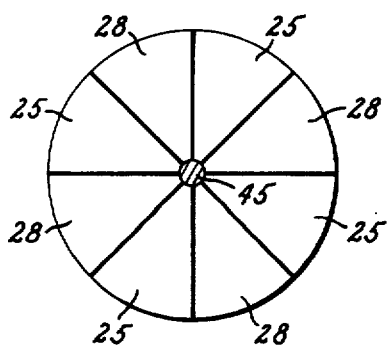
FIG. 3 is a reduced-size sectional view along the line 3—3 of FIG. 2, showing the segments of the two stators of the voltmeter.

Grounded plate 22 contains a circular central opening 24, and within this opening there are provided two electrodes in the form of stators, each facing the high-voltage electrode, or plate, 20. Each of these stators comprises a plurality of flat metal segments disposed in a common horizontal plane and arranged in angularly-spaced relationship about a central axis. These segments are best shown in FIG. 3, where the segments of one stator (Stator I) are designated 25, and the segments of the other stator (Stator II) are designated 28. The individual segments of each stator are electrically connected to each other, i.e., all of the segments 25 are electrically connected to each other; and all of the segments 28 are electrically connected to each other. As shown in FIG. 3, the segments 25 of one stator are physically interposed between the segments 28 of the other stator but are electrically insulated from segments 28.

For supporting the stator segments 25 and 28, a stationary insulating plate 30 is provided, as shown in FIG. 2. Insulating plate 30 is mounted on the stationary housing 32 of an electric motor 33. The motor housing is, in turn, mounted on a bracket 34 of U-shaped cross-section that is a ground potential. Spaced metal posts 35 support the grounded plate 22 on bracket 34.

Figure 4:
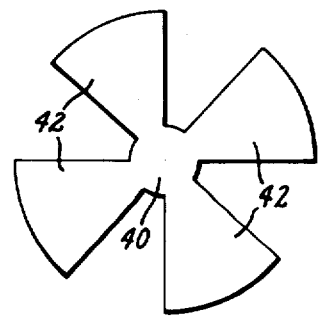
FIG. 4 is a reduced-size sectional view along the line 4—4 of FIG. 2 showing the rotor of the voltmeter.

Physically interposed between high voltage plate 20 on one hand and the two stators on the other hand is a rotor 40 that is maintained at ground potential. This rotor 40, which is best shown in FIG. 4, is a flat disc of metal comprising four sector-shaped metal vanes 42 that are arranged in angularly-spaced relationship about the center axis of the rotor. The vanes 42 are angularly spaced by an amount slightly less than the angular spacing between the segments of each stator. When the rotor 40 is rotated about its central axis, the vanes alternately cover and uncover the stator segments 25 and 28. Each of the vanes 42 is of such a size that it can completely cover any one of the stator segments 25 or 28 when angularly aligned therewith. In a preferred form of the invention, each of the vanes is slightly larger than each stator segment and overlaps any angularly-aligned stator segment by a sufficient amount that no significant electric field from the high voltage plate 20 reaches the covered stator segment when angularly-aligned with the vanes. When one of the vanes 42 is angularly aligned with a segment of either stator, the other vanes are angularly aligned with the remaining segments of the same stator. Thus, as the rotor 40 rotates, the vanes 42 act to cover the segments of one stator as they uncover the segments of the other stator. When the segments of one stator are completely covered by the vanes 42, the segments of the other stator are at maximum exposure to the high voltage plate 20. Each of the stator segments 25 and 28 has substantially the same area facing the high voltage plate 20.

An important feature of the rotor-stator relationship is that the total area of the two stators that is exposed to the electric field from the high voltage plate remains constant as the rotor rotates. The significance of this feature will soon appear more clearly.

The rotor 40 is mounted on the shaft 45 of the electric motor 33. This shaft is suitably electrically connected to ground. The motor is a constant-speed motor which is energized whenever it is desired to measure the voltage on high voltage plate 20. Normally, the motor 33 will be continuously energized. In a specific embodiment of the invention, the shaft speed of the motor is about 3585 rpm.

Figure 5:
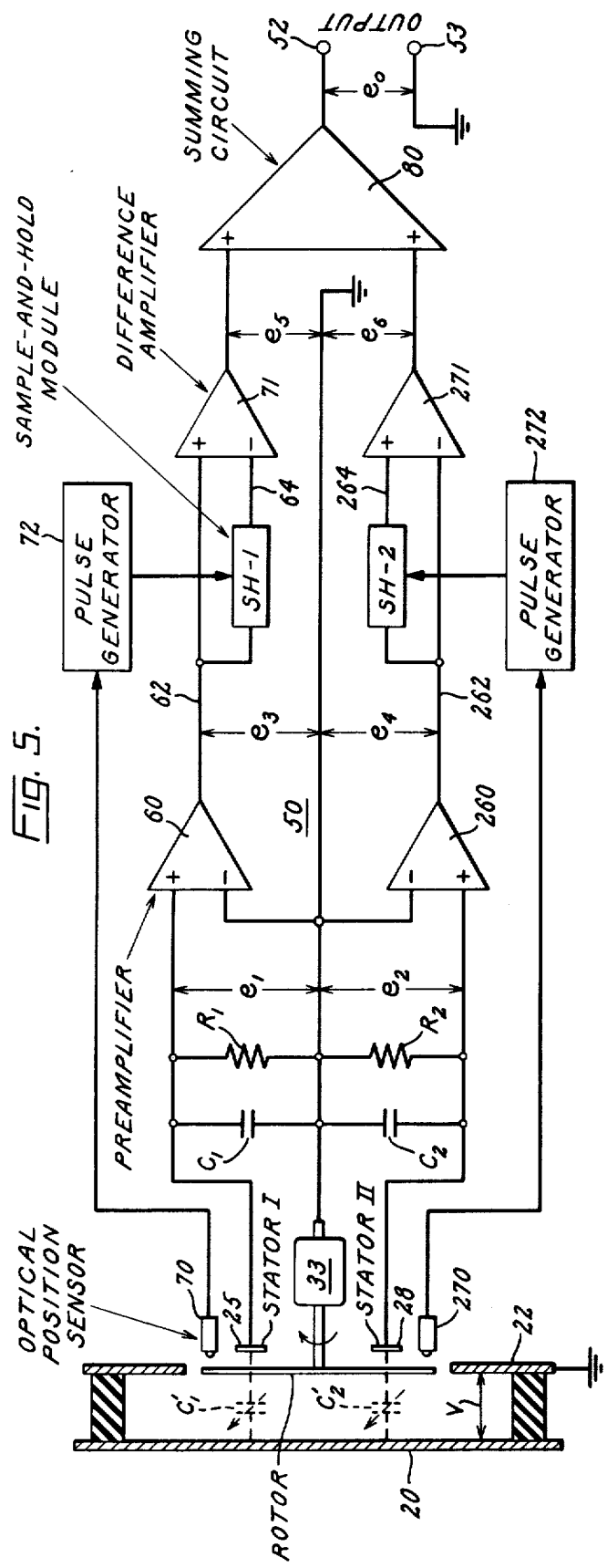
FIG. 5 is a schematic showing of our voltmeter showing its electronic circuitry in diagrammatic form.

Referring to the schematic diagram of FIG. 5, it will be seen that a capacitor $C_1$ is connected between stator I and ground, and a capacitor $C_2$ is connected between stator II and ground. Connected in parallel with capacitor $C_1$ is a resistor $R_1$ and in parallel with capacitor $C_2$ is a resistor $R_2$. Typical values for these components are 0.05 microfarads for each capacitor $C_1$ and $C_2$ and 100 megohms for each resistor $R_1$ and $R_2$.

In FIG. 5, the capacitance between the high voltage electrode, or plate, 20 and stator I is designated $C_1'$, and the capacitance between high voltage electrode 20 and stator II is designated $C_2'$. These capacitances $C_1'$ and $C_2'$ are very small compared to the fixed capacitances $C_1$ and $C_2$, preferably about 0.5 picofarads when the segments of each stator are effectively completely uncovered by the vanes of the rotor. When the segments of a given stator are effectively completely covered by the rotor vanes, the capacitance $C_1'$ or $C_2'$, as the case may be, is reduced to approximately zero. When the rotor 40 is rotated at $59\frac{3}{4}$ revolutions per second, capacitances $C_1'$ and $C_2'$ vary between zero and 0.5 picofarads at a rate of 239 Hz. This rate follows from the fact that in the illustrated embodiment there are four vanes on the rotor and four segments on each stator, thus driving $C_1'$ and $C_2'$ to zero four times each revolution.

Figure 6:
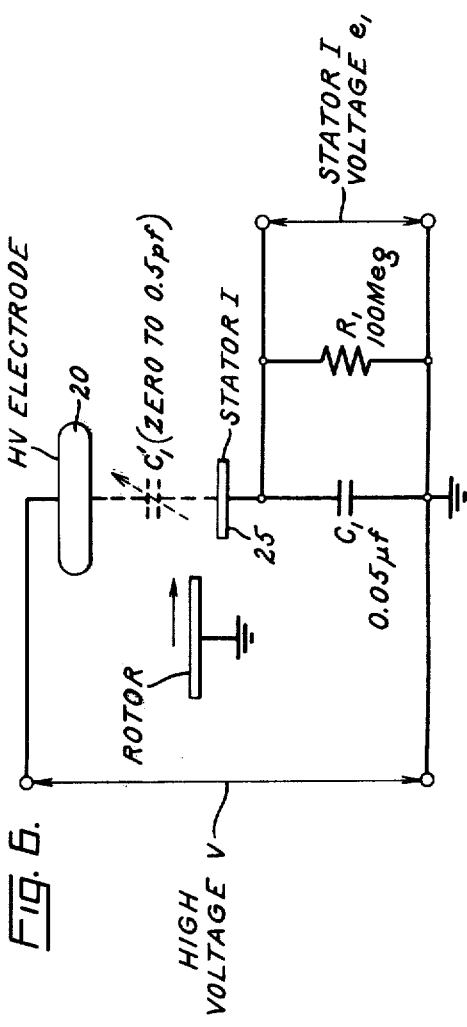
FIG. 6 depicts the equivalent circuit for the input components associated with Stator I.

An equivalent circuit for the input components associated with stator I is shown in FIG. 6. It will be apparent from this figure that the series combination of $C_1'$ and $C_1$ acts as a capacitive voltage divider. $C_1'$ is a time-varying capacitance, and $C_1$ is a fixed capacitance. Since $C_1$ in the specific embodiment described is 0.05 microfarads and $C_1'$ is 0.5 picofarads when the stator I is effectively fully uncovered, the ratio of the divider under such conditions is 100,000 to 1. Since $R_1$ is assumed to be 100 megohms in this embodiment, the decay time constant for the circuit $R_1 C_1$ is 5 seconds.

A corresponding equivalent circuit (not shown) can be drawn for the input components associated with stator II.

Connected across $R_1$ and $R_2$ is electronic circuitry 50 that processes the signals $e_1$ and $e_2$ appearing across $R_1$ and $R_2$, respectively, in a manner soon to be described and produces an output voltage $e_o$ across output terminals 52 and 53 that is proportional to the voltage V between the high voltage electrode 20 and ground. Each of the input voltages, $e_1$ and $e_2$, to the electronic circuitry consists of a-c and d-c components. The a-c component is formed by the product of the rotor frequency and voltage V applied between the high voltage electrode 20 and the ground. As will be apparent from FIG. 6, this voltage, in the case of stator I, is capacitively divided between the small time-varying capacitance $C'_1$ and the large fixed capacitance $C_1$.

The d-c component of the input voltage $e_1$ is produced by the d-c voltage on the high voltage electrode 20. Referring to FIG. 6, this d-c component cannot be faithfully maintained by the capacitor divider because it is slowly drained away from capacitor $C_1$ by resistor $R_1$, which protects the electronic circuitry. Therefore, the d-c component of $e_1 (t)$ contains a d-c error $\epsilon_1 (t)$ which increases as capacitor $C_1$ is discharged. This error in $e_1 (t)$ must be eliminated if the high voltage is to be accurately reproduced by the generating voltmeter.

The following is a step-by-step example of how the voltages $e_1$ and $e_2$ vary with time, with particular reference being had to FIGS. 5 and 7.

First, assume that the rotor motor is off (so that the vanes are not moving), and that the high voltage V has been off for an extended time. Assume next that the grounded rotor vanes are effectively completely covering stator II so that $C_2'$ is zero and $C_1'$ is at its maximum value.

Now let us switch on the high voltage V at time $t_1$, bringing it rapidly up to +100 kV in a few microseconds (FIG. 7). The voltage $e_1$ will jump from zero to +1.0 volt because of the voltage-dividing action of $C_1'$ and $C_1$. Capacitor $C_1$ immediately begins to discharge into resistor $R_1$ with a 5-second time constant, causing $e_1$ to decay slowly. The input voltage, $e_2$, from stator II remains at zero because $C_2'$ under the assumed conditions is zero.

Now assume that the rotor motor is switched on at time $t_2$, when $e_1$ has decayed from +1.0 volt down to +0.9 volt. For this example, we assume that the motor comes up to speed instantaneously. As the rotor starts to cover the segments of stator I, $e_1$ starts to drop because $C_1'$ is decreasing. Similarly $e_2$ starts to rise as the rotor begins to expose the segments of stator II to the field from the high voltage electrode.

When the rotor has effectively completely covered the segments of stator I at time $t_3$, $e_1$ will have decreased by 1 volt from the +0.9 volts it had at time $t_2$. Thus, at time $t_3$, $e_1$ is at −0.1 volt. Note that the segments of stator I are electrically shielded from the high voltage electrode at time $t_3$, but that the voltage $e_1 (t_3)$ is not zero. This non-zero voltage is the error voltage $\epsilon_1$, which erroneously indicates that the high voltage electrode is inducing a voltage $\epsilon_1$ on the segments of the stator I, even though these stator segments are electrically shielded from the high voltage electrode. As capacitor $C_1$ discharges through resistor $R_1$, the error voltage $\epsilon_1$ will slowly increase until the average voltage of $e_1$ is nearly zero, and $\epsilon_1 = -0.5$ V.

Referring to the Stator II voltage in FIG. 7, at time $t_3$, the segments of stator II are fully exposed to the field from the high voltage electrode, so that $e_2$ will be almost +1.0 volt. This input voltage $e_2$ will also slowly decay as $C_2$ discharges through $R_2$. Note that $e_1$ reaches a maximum when $e_2$ is at a minimum and vice versa. Stated otherwise, $e_1$ and $e_2$ are 180° out of phase with each other.

ELECTRONIC CIRCUITRY 50

Electronic circuitry 50 is relied upon to process the above-described input signals $e_1$ and $e_2$ and to derive therefrom an output signal $e_o$ that is directly proportional to the voltage V. This circuitry 50 comprises a preamplifier 60 connected across resistor $R_1$ for amplifying the input signal $e_1$ to a more convenient voltage and current level. This preamplifier is a conventional operational amplifier having high input impedance, low input bias currents, and low d-c drift.

For deriving from the output of preamplifier 60 a signal that is proportional to the error quantity $\epsilon_1 (t)$ depicted in FIG. 7, we provide a sample-and-hold module, or circuit, SH-1. This module is of a conventional design and acts when energized by a suitable pulse to sample the instantaneous value of voltage $e_3$ appearing at 62 and to provide an output voltage at 64 that is equal to this instantaneous value of $e_3$. This output signal from module SH-1 remains constant until the module is energized by another suitable pulse, at which time the same sampling-and-holding operation is repeated until the module receives a new energizing pulse.

Such an energizing pulse is applied to the sample-and-hold module SH-1 each time the rotor 40 reaches a point where its vanes effectively completely cover the segments of the stator I. This instant is sensed by a suitable optical position sensor 70 that is sensitive to the position of the rotor. Each time the leading edge of a rotor vane intercepts a suitably positioned light beam, the sensor 70 develops an output signal that is supplied to a pulse generator 72, which immediately responds by supplying an energizing pulse to the sample-and-hold module SH-1.

The sample-and-hold module SH-1 responds by sensing the preamplifier's instantaneous value of output voltage $e_3$ at 62 at this instant when the segments of stator I are effectively completely covered and by developing an output signal at 64 of the same magnitude and polarity as this instantaneous value of output voltage $e_3$. This output signal at 64 is maintained until the segments of stator I are once again effectively completely covered. The output signal at 64 is equal in magnitude to the error signal $\epsilon_1(t)$ in FIG. 7 times the gain of the preamplifier 60.

The output voltage $e_3$ at 62 from the preamplifier and the output voltage at 64 from the sample-and-hold module SH-1 are supplied to a difference amplifier 71. This difference amplifier subtracts the signal at 64, which in the example of FIG. 7 would be a negative signal, from the signal $e_3$ at 62 and produces an output $e_5$ proportional to this difference.

The effect of this subtraction is to restore the proper zero level to $e_3$. In this regard, consider the wave form of $e_3(t)$, which is the same as that of $e_1(t)$, except for a scale factor. If the d-c component $e_1(t)$ were not drained by resistor $R_1$, as previously described, the value of $e_3$ would be zero whenever the rotor vanes effectively covered the segments of stator I. However, the voltage $e_3$ contains an error voltage $\epsilon_3(t)$ which is caused by charge drainage through $R_1$. By subtracting this error voltage $\epsilon_3(t)$ from $e_3(t)$, this error can be eliminated, and the resultant signal will be zero whenever the segments of the stator I are effectively covered. This subtraction takes place inside difference amplifier 71, using the error signal from module SH-1. Thus, the output signal at $e_5$ (referred to herein as an intermediate signal) has its zero level restored so that it contains the correct d-c component.

Circuitry 50 contains an additional set of components for processing a second input voltage ($e_2$) to produce a second intermediate signal ($e_6$) in essentially the same manner as the first input voltage ($e_1$) is processed by the above-described components to produce the first intermediate signal $e_5$. More specifically, a preamplifier 260 is provided for amplifying the voltage $e_2$, and this preamplifier corresponds to the preamplifier 60. Preamplifier 260 has conventional means (not shown) for adjusting its gain, and this gain is so adjusted that $e_6$ has an amplitude equal to that of $e_5$ when the voltmeter is measuring a constant d-c high voltage.

For deriving from the output ($e_4$) of preamplifier 260 a signal that is proportional to the error quantity $\epsilon_2(t)$ depicted in FIG. 7, a sample-and-hold circuit, or module, SH-2 is provided. This module SH-2 is controlled by an optical position indicator 270 and a pulse generator 272. Module SH-2 samples the output voltage $e_4$ from the preamplifier at each instant that the vanes of the rotor 40 effectively completely cover the segments of stator II and develops an output voltage at 264 that is held until the segments of stator II are again effectively completely covered. The output voltage $e_4$ and that at 264 are subtracted in a difference amplifier 271, and this difference is amplified by amplifier 271 to provide an output in the form of intermediate voltage $e_6$ that is proportional to this difference. Difference amplifier 271 has the same gain as difference amplifier 70. The intermediate voltage $e_5$ and $e_6$, considered with respect to their dominant frequencies, are out of phase with each other by 180°, as will be apparent from FIGS. 8(d) and 8(e).

For providing an output signal across the terminals 52 and 53 that is of essentially the same wave form as the applied high voltage V, the signals $e_5$ and $e_6$ are added together in a summing circuit 80. The output from this circuit is a voltage $e_o$ appearing across terminals 52 and 53. That this sum gives the original, undistorted waveform shape can be understood by considering the construction of the stator segments. As the rotor 40 turns, its vanes alternately cover and uncover portions of the stator segments, and $C_1'$ and $C_2'$ each vary from 0 to 0.5 pf. However, the total area of the two stators which is exposed to the high voltage remains constant, even though the rotor is turning. Thus, the sum of capacitance $C_1'$ and $C_2'$ is also constant, because this total capacitance depends on the total area of the two stators which is exposed to the high voltage electrode. Now, the voltages $e_5$ and $e_6$ each include the modulating effect of the changing capacitances of $C_1'$ and $C_2'$ so that neither correctly represents the high voltage waveform. However, the sum signal ($e_5 + e_6$) is proportional to the voltage which is seen by the constant capacitance $C_1' + C_2'$. This voltage is not modulated by 239 Hz, since the divider ratio $C_1'/(C_1' + C_2')$ is constant. Therefore, the sum ($e_5 + e_6$) provides a correct representation of the applied high voltage waveform for both a-c and d-c components.

As pointed out hereinabove, when the voltmeter is measuring a constant d-c high voltage, $e_5$ and $e_6$ are of equal amplitude. Since $e_5$ and $e_6$ are 180° out of phase with each other, they will sum to a constant value when the voltmeter is measuring a constant value of d-c high voltage. It is to be noted that $e_5$ and $e_6$ are 180° out of phase with each other in all their dominant and harmonic frequency wave forms when representing a constant high voltage level.

In practice, the sample-and-hold modules SH produce narrow switching transients, typically less than a microsecond wide and about 100 millivolts high. These transients are reduced by an output loss-pass filter (not shown) which is present in the summing circuit 80. This filter is the primary limitation on the frequency response of the voltmeter. In FIG. 8(f), these switching transients are represented by the slight perturbations P in the $e_o$ wave form. In the specific embodiment described hereinabove, these perturbations have an amplitude less than about 0.1% of $e_o$ after being filtered by the aforesaid low-pass output filter.

The flat frequency response of the rapid-response generating voltmeter (which in one embodiment is $\pm$ 0.5% from d-c to 1 kHz) is a consequence of the facts that very low applied frequencies are shifted upward to the range of 239 Hz by the rotor motion, and that the 239 Hz modulation is removed by summing $e_5$ and $e_6$. All signals processed by the circuitry 50 are far away from zero frequency so that divider impedances, offsets, and other amplification problems do not introduce errors into the final waveform. After all signal processing is completed, the 239 Hz component is removed.

RESPONSE TO AN APPLIED STEP VOLTAGE

As an example of the combined a-c and d-c performance of the rapid-response generating voltmeter, FIG. 8 is provided to show the signals $e_1$ to $e_o$ which would occur for an applied step voltage. This applied voltage is similar to that of FIG. 7, except for where the step occurs. At this point, the frequency response is quite important. In one specific embodiment, the generating voltmeter can respond to frequencies up to 1 kHz without distortion, thus typically enabling the step to be accurately reproduced within 0.5 msec. In FIG. 8 signals $e_5$ and $e_6$ (depicted in curves (d) and (e) show the effect of the SH modules, and $e_o$ (depicted in curve f) shows the output waveform of the electronic circuitry 50.

In FIG. 8(b) the stator I output voltage $e_1$ following the step shows the effect of the capacitor $C_1$ discharging through $R_1$. The dotted-line error signal $\epsilon_1(t)$, which is negative, is subtracted from $e_1$ and the difference amplified to produce the wave form $e_5$ of FIG. 8d. The similarly derived corrected voltage $e_6$ of FIG. 8e is added to that of FIG. 8d to produce the wave form $e_o$ of FIG. 8f.

FIG. 9 illustrates how our voltmeter acts when the voltage being measured is a negative polarity voltage V otherwise of the same waveform as that of FIG. 8. The stator I output voltage $e_1$ will have the waveshape shown in FIG. 9b. When the segments of stator I are effectively fully uncovered, the instantaneous value of $e_1$ will be negative, and when the segments are effectively fully covered, the instantaneous value of $e_1$ will be positive. The output voltage $e_3$ from preamplifier 60 will have the same waveform as $e_1$. The sample-and-hold module SH-1 will thus produce a positive polarity correction signal, which when subtracted from the main signal $e_3$ in difference amplifier 70 will produce a negatively-offset output at $e_5$, as shown in FIG. 9d. As shown in FIG. 9e, the circuit across stator II will similarly produce a negatively-offset output at $e_6$ when the voltage V is negative. As shown in FIG. 9f, the two negatively-offset outputs $e_5$ and $e_6$ in the summing circuit 80 will provide a negative polarity output signal at $e_o$, thus accurately reflecting the polarity, as well as the magnitude, of the voltage V being measured.

GENERAL DISCUSSION

The following are some of the advantages of our rapid-response generating voltmeter. It is very compact, especially when the electrodes are contained in a pressurized dielectric gas such as sulfur hexafluoride. Its response time is at least 1000 times faster than the basic generating voltmeter referred to hereinabove in the introduction and comparable with resistor-capacitor dividers. Accuracies of ± 0.5% are attainable with out device, which are as good as or better than with typical precision resistor dividers. It is a very versatile device in that its mechanical and electronic design can remain the same for all voltages. Only size, spacing, and insulation of the high voltage electrodes need to be redesigned to accommodate different voltages. It has a low power consumption, consuming only about 100 watts as compared to a kilowatt or more for comparable resistive dividers.

In terms of fidelity of output with respect to input, our rapid-response generating voltmeter follows all variations up to a high audio frequency in d-c or a-c high voltage, preserving polarity information. This makes our device superior to the basic generating voltmeter in any application where the voltage to be measured is not "clean", i.e., wherever there are switching transients, ripple, harmonic components, voltage fluctuations, and the like.

While we have shown and described a particular embodiment of our invention, it will be obvious to those skilled in the art that various changes and modifications may be made without departing from our invention in its broader aspects; and we, therefore, intend herein to cover all such changes and modifications as fall within the true spirit and scope of our invention.

What we claim as new and desire to secure by Letters Patent of the United States is:

1. In a rapid-response generating voltmeter for measuring a high d-c voltage applied between first and second spaced-apart points,
   a. a first electrode adapted to operate at the potential of said first point,
   b. a second electrode spaced from said first electrode and comprising a first stator including a plurality of segments arranged in angularly-spaced relationship about a predetermined center and electrically connected together so as to be at the same potential as each other,
   c. a first capacitor connected between said first stator and said second point,
   d. a third electrode spaced from said second electrode, electrically insulated from said second electrode, and comprising a second stator including a plurality of segments arranged in angularly-spaced relationship about said center and positioned physically between the segments of said first stator, the segments of said second stator being electrically interconnected so as to be at the same potential as each other,
   e. a second capacitor connected between said second stator and said second point,
   f. capacitance-varying means for periodically varying substantially simultaneously in opposite senses the capacitance between said first electrode and said second electrode and the capacitance between said first electrode and said third electrode, said capacitance-varying means comprising a rotatable rotor having vanes normally at the potential of said second point located between said first electrode on one hand and the segments of said stators on the other hand, rotation of said rotor causing said vanes to gradually cover the segments of one stator with respect to said first electrode as said vanes gradually uncover the segments of the other stator with respect to said first electrode,
   g. said rotor vanes effectively completely covering the segments of said first stator at successive instants spaced in time by predetermined successive first intervals,
   h. first circuit means for sensing the voltage across said first capacitor and for developing during said first intervals a first intermediate signal varying in magnitude directly in accordance with: the voltage then present across said first capacitor minus a first error voltage substantially equal to the voltage across said first capacitor at the start of each of said first intervals,
   i. said rotor vanes effectively completely covering the segments of said second stator at successive instants spaced in time by predetermined successive second intervals,
   j. second circuit means for sensing the voltage across said second capacitor and for developing during said second intervals a second intermediate signal varying in magnitude directly in accordance with the voltage then present across said second capacitor minus an error voltage substantially equal to the voltage across said second capacitor at the start of each of said second intervals,
   k. and summing means for developing an output signal substantially proportional to the instantaneous sum of said first and second intermediate signals.

2. In a rapid-response generating voltmeter for measuring a high d-c voltage applied between first and second spaced-apart points,
   a. a first electrode adapted to operate at the potential of said first point,
   b. a second electrode spaced from said first electrode and comprising a first stator including a plurality of segments arranged in angularly-spaced relationship about a predetermined center and electrically connected together so as to be at the same potential as each other, c. a first capacitor connected between said first stator and said second point, d. a third electrode spaced from said first electrode, electrically insulated from said second electrode, and comprising a second stator including a plurality of segments arranged in angularly-spaced relationship about said center and positioned physically between the segments of said first stator, the segments of said second stator being electrically interconnected so as to be at the same potential as each other, e. a second capacitor connected between said second stator and said second point, f. capacitance-varying means for periodically varying substantially simultaneously in opposite senses the capacitance between said first electrode and said second electrode and the capacitance between said first electrode and said third electrode, said capacitance-varying means comprising a rotatable rotor having vanes normally at the potential of said second point located between said first electrode on one hand and the segments of said stators on the other hand, rotation of said rotor causing said vanes to gradually cover the segments of one stator with respect to said first electrode as said vanes gradually uncover the segments of the other stator with respect to said first electrode, g. first circuit means for sensing the voltage across said first capacitor while said rotor is rotating and for developing a first intermediate signal varying in magnitude directly in accordance with: the instantaneous voltage then present across said first capacitor minus a first error voltage substantially equal to the voltage appearing across said first capacitor at the immediately-preceding instant when the segments of said first stator were effectively completely covered by the vanes of said rotating rotor, h. second circuit means for sensing the voltage across said second capacitor while said rotor is rotating and for developing a second intermediate signal varying in magnitude directly in accordance with: the instantaneous voltage then present across said second capacitor minus a second error voltage substantially equal to the voltage appearing across said second capacitor at the immediately-preceding instant when the segments of said second stator were effectively completely covered by the vanes of said rotating rotor, and i. summing means for developing an output signal substantially proportional to the instantaneous sum of said first and second intermediate signals.

3. The voltmeter of claim 2 in which at least one of said first and second circuit means includes gain adjusting means adjustable to make the intermediate signal developed by the associated circuit means substantially equal in amplitude to that of the other intermediate signal when the voltmeter is measuring a constant d-c high voltage.

4. The voltmeter of claim 2 in which said first circuit means includes:

a. means for deriving a first signal substantially proportional by a predetermined multiplier to the instantaneous voltage across said first capacitor, b. a first sample-and-hold circuit that acts to provide a first correction signal proportional also by said predetermined multiplier to the voltage across said first capacitor each time the segments of said first stator are effectively completely covered by the vanes of said rotor, the amplitude of said correction signal being maintained substantially constant between successive instants at which said segments of said first stator are effectively completely covered, c. and first difference circuit means for subtracting said first correction signal from said first signal and for developing said first intermediate signal substantially in proportion to the difference resulting from said substraction.

5. The voltmeter of claim 4 in which said second circuit means includes:

a. means for deriving a second signal substantially proportional by a predetermined second multiplier to the instantaneous voltage across said second capacitor, b. a second sample-and-hold circuit that acts to provide a second correction signal proportional also by said second predetermined multiplier to the voltage across said second capacitor each time the segments of said second stator are effectively completely covered by the vanes of said rotor, the amplitude of said second correction signal being maintained substantially constant between successive instants at which the segments of said second stator are effectively completely covered, c. and second different circuit means for subtracting said second correction signal from said second signal and for developing said second intermediate signal substantially in proportion to the difference resulting from said latter subtraction.

6. The generating voltmeter of claim 2 in which:

a. said first intermediate signal developed by said first circuit means is a time-varying signal having a dominant frequency proportional to the rotational speed of said rotor, b. said second intermediate signal developed by said second circuit means is a time-varying signal having a dominant frequency proportional to the rotational speed of said rotor, c. said two intermediate signals are approximately 180° out of phase with each other, considered with respect to their dominant frequency waveforms.

7. The generating voltmeter of claim 6 in which the sum of (i) the capacitance between said first electrode and said second electrode and (ii) the capacitance between said first electrode and said third electrode remains substantially constant during rotation of said rotor.

8. The generating voltmeter of claim 6 in which: said first and second intermediate signals sum to a constant when the voltmeter is measuring a constant level of high voltage.

9. The generating voltmeter of claim 8 in which the sum of (i) the capacitance between said first electrode and said second electrode and (ii) the capacitance between said first electrode and said third electrode remains substantially constant during rotation of said rotor.

10. The generating voltmeter of claim 2 in which the sum of: (i) the capacitance between said first electrode and said second electrode and (ii) the capacitance between said first electrode and said third electrode remains substantially constant during rotation of said rotor.

11. The generating voltmeter of claim 4 in which the sum of: (i) the capacitance between said first electrode and said second electrode and (ii) the capacitance between said first electrode and said third electrode remains substantially constant during rotation of said rotor.

12. The generating voltmeter of claim 5 in which the sum of: (i) the capacitance between said first electrode and said second electrode and (ii) the capacitance between said first electrode and said third electrode remains substantially constant during rotation of said rotor.

13. The generating voltmeter of claim 2 in which:
   a. said first capacitor is large with respect to the capacitance between said first electrode and said second electrode even when the stator segments of said second electrode are effectively completely uncovered, and
   b. said second capacitor is large with respect to the capacitance between said first electrode and said third electrode even when the stator segments of said third electrode are effectively completely uncovered.

14. The generating voltmeter of claim 2 in which said first and second intermediate signals sum to a constant when the voltmeter is measuring a constant level of high voltage.

* * * * *